United States Patent [19]

Hatta et al.

[11] Patent Number: 4,806,446
[45] Date of Patent: Feb. 21, 1989

[54] PHOTOSENSITIVE RECORDING MEDIUM CAPABLE OF IMAGE CONTRAST ADJUSTMENT

[75] Inventors: Naoyuki Hatta, Gamagori; Satoshi Furukawa, Suzuka, both of Japan

[73] Assignee: Brother Kogyo Kabushiki Kaisha, Aichi, Japan

[21] Appl. No.: 34,681

[22] Filed: Apr. 6, 1987

[30] Foreign Application Priority Data

Apr. 9, 1986 [JP] Japan .................. 61-81579
Apr. 10, 1986 [JP] Japan .................. 61-82481

[51] Int. Cl.⁴ .................. G03C 1/40; G03C 1/00;
G03C 1/46; G03C 1/72
[52] U.S. Cl. .................. 430/138; 252/600;
427/213.31; 428/402.2; 428/402.21;
428/402.24; 430/211; 430/512; 430/926
[58] Field of Search .............. 430/138, 926, 572, 333,
430/211; 427/213-231; 252/600; 428/402.2,
402.21, 402.24

[56] References Cited

U.S. PATENT DOCUMENTS 4,399,209 8/1983 Sanders et al. .................. 430/138
4,440,846 4/1984 Sanders et al. .................. 430/138
4,576,891 3/1986 Adair et al. .................. 430/138
4,587,194 5/1986 Adair et al. .................. 430/138

*Primary Examiner*—Mukund J. Shah
*Attorney, Agent, or Firm*—Parkhurst, Oliff & Berridge

[57] ABSTRACT

A photosensitive recording medium having a multiplicity of microcapsules formed on a substrate, and a developer material, each microcapsule having a photosensitive resin and a chromogenic material which reacts with the developer layer to form a colored image spot. The microcapsules comprise a plurality of microcapsule groups which are sensitive to radiations having different wavelength bands, or which are sensitive to different intensities of the radiation. An image recording system is provided with an illuminating device for generating radiations of different wavelengths falling within the wavelength bands of the microcapsule groups, or a radiation of variable intensity. The recording system has a selector for selecting at least one of the radiations of the different wavelengths, or one of the intensity levels of the radiation, in order to adjust the contrast of the images formed on the medium, with respect to non-image areas on the medium.

2 Claims, 3 Drawing Sheets

PHOTOSENSITIVE RECORDING MEDIUM CAPABLE OF IMAGE CONTRAST ADJUSTMENT

BACKGROUND OF THE INVENTION

1. Field of the Invention

The present invention relates to a photosensitive recording medium and an image transfer system using such a medium, and more particularly to an image transfer technique utilizing photosensitive microcapsules, wherein a contrast of images formed on the medium may be adjusted with a minimum influence by a difference in photosensitivity of the microcapsules, a fluctuation in the intensity of a radiation to which the medium is exposed, or a fluctuation in developing conditions of the medium.

2. Discussion of the Prior Art

There is known a photosensitive recording medium having a multiplicity of microcapsules on one surface of its substrate. Each microcapsule includes a photosensitive resin, and a normally colorless chromogenic material which reacts with a developer material to produce a colored image spot, as a result of selective image-wise exposure of the medium and a subsequent developing process. The contrast of the formed images with respect to non-image areas of the medium is changed as a function of a difference in the exposure amount between the image and non-image areas. For example, such a photosensitive medium is disclosed in U.S. Pat. No. 4,399,209. The adjustment of the image contrast may be achieved by changing either the amount of exposure of the medium to an image-forming radiation, or the developing condition, such as a pressure by which the unexposed microcapsules are ruptured for image-forming reaction between the chromogenic and developer materials.

Conventionally, all microcapsules having the same chromogenic material for one color (including black) have the same photosensitive property, and therefore the image contrast adjustment is relatively difficult. More specifically, where the adjustment is accomplished by changing the amount of exposure of the medium to a radiation, this exposure amount must be adjusted within a relatively narrow photosensitive range of the microcapsules in which the density of the images formed on the medium is varied as a function of the exposure amount given to the medium. On the other hand, the intensity of the radiation generated by a light source or lamp is considerably time-wise fluctuated due to a variation in the temperature. Further, the amount of light generated per unit of the medium considerably differs locally along the length of the lamp. Thus, it is inevitably difficult to attain a precise adjustment of the contrast of the image areas formed on the medium, with respect to the non-image areas. In the case where the contrast adjustment is accomplished by changing the nip pressure of developing rollers to be exerted to the unruptured microcapsules on the medium, for example, the mechanism constructed for stable adjustment of the nip pressure tends to be complicated and large. Further, it is difficult to achieve a fine adjustment of the nip pressure over the entire length of the developing rollers.

SUMMARY OF THE INVENTION

It is accordingly a first object of the present invention to provide a photosensitive recording medium capable of adjusting the image contrast, with a minimum influence by a fluctuation in the intensity of a radiation to which the medium is image-wise exposed, or a fluctuation in the developing condition of the image-wise exposed medium.

It is a second object of the present invention to provide an image transfer system adapted for transferring images to such a photosensitive recording medium.

The first object may be achieved according to one aspect of the invention, which provides a photosensitive recording medium having a substrate, a multiplicity of microcapsules on one surface of a substrate, and a developer material, each of the microcapsules including a photosensitive resin, and a normally colorless chromogenic material, wherein images are formed by image-wise selectively exposing the multiplicity of microcapsules to a radiation, rupturing the microcapsules in image areas, and releasing the chromogenic material from the ruptured microcapsules, for an image-forming reaction between the released chromogenic material and the developer material, such that a contrast of the formed images with respect to non-image areas of the medium is changed as a function of a difference in an amount of exposure to the radiation between the image and non-image areas. The instant photosensitive recording medium is characterized in that the multiplicity of microcapsules include a plurality of microcapsule groups for each of at least one color produced as a result of the image-forming reaction between the chromogenic material and the developer material. The microcapsule groups are sensitive to different wavelength bands of the radiation, respectively.

Where the images are formed on the photosensitive recording medium of the invention as described above, the second object may be achieved according to the invention, which provides an image transfer system adapted for transferring images from an original to the photosensitive recording medium, the system comprising an illuminating device for irradiating the original with radiations having different wavelengths falling within the different wavelength bands of the microcapsule groups, and selector means connected to the illuminating device, for selecting at least one of the radiations having the different wavelengths, so as to correspondingly image-wise expose at least one of the microcapsule groups, so that the image contrast is adjusted depending upon the number of the image-wise exposed microcapsule group or groups.

Alternatively, the image transfer system may be adapted to include an image-forming illuminating device, an auxiliary illuminating device, and selector means. The image-forming illuminating device is adapted to generate an image-forming radiation for irradiating the original, so as to image-wise expose the photosensitive medium and thereby form latent images corresponding to the images on the original. The image-forming radiation has a wavelength band which covers the different wavelength bands of radiation to which the respective microcapsule groups are sensitive. The auxiliary illuminating device is adapted to generate at least one contrast-adjusting radiation each having a wavelength which falls within one of the different wavelength bands of the microcapsule groups, so as to selectively expose at least one of the microcapsule groups, before or after the exposure of the medium to the image-forming radiation. The selector means selects the at least one contrast-adjusting radiation generated by the auxiliary illuminating device, so as to adjust the image contrast, depending upon the number of the at least one microcapsule group that is exposed to the respective contrast-adjusting radiation or radiations generated by the auxiliary illuminating device.

According to the above aspect of the present invention, the microcapsules for the same color consist of a plurality of groups which are sensitive to respective wavelength bands of radiations. The image contrast may be adjusted by the selector means which selects at least one of the radiations having the wavelengths which fall within the respective wavelength bands of the microcapsule groups, during, before or after the image-forming exposure of the medium. For example, the illuminating device includes a plurality of light sources which generate the radiations having the different wavelengths falling within the wavelength bands of the individual microcapsule groups, and the selector means selectively activates at least one of the light sources. In this case, the image contrast adjustment is achieved by selecting at least one of the light sources, i.e., at least one of the radiations to which the medium is image-wise exposed for an image-forming reaction between the chromogenic material and the developer material of the microcapsules.

In the case where the illuminating apparatus consists of the image-forming illuminating device and the auxiliary illuminating device, the image contrast adjustment is attained by selecting at least one of the contrast-adjusting radiations generated by the auxiliary illuminating device, to which the medium is exposed before or after the medium is image-wise exposed to the image-forming radiation generated by the image-forming illuminating device.

In either case, the contrast of the images formed on the medium with respect to the non-image areas on the medium can be adjusted by means of the selector means which selects the microcapsule group or groups that is/are exposed to the respective radiation or radiations generated by the image-forming illuminating device during the image-forming process (during formation of latent images on the medium), or by the auxiliary illuminating device before or after the formation of the latent images due to exposure to the image-forming radiation whose wavelength band covers the wavelength bands of all the microcapsule groups for the given color. Thus, the photosensitive medium or image transfer system according to the present aspect of the invention permits a stable adjustment of the image contrast, without being influenced by a fluctuation in the intensity of the radiation due to a variation in the operating temperature of the illuminating device, or a difference in the radiation intensity along the length of the light source, or due to a fluctuation in the condition under which the latent images formed on the image-wise exposed medium are developed into visible images as a result of the image-forming reaction between the chromogenic and developer materials of the medium. Further, the instant medium and system do not require changing the developing condition, such as the nip pressure of developing rollers, and therefore avoid an increase in the cost of the developing device due to otherwise needed complicated and large-sized mechanisms for adjusting the developing condition.

According to one feature of the photosensitive medium of the invention, the medium comprises the substrate primarily consisting of a paper material, a developer layer which is formed on the substrate and which includes the developer material that reacts with the chromogenic material, and the microcapsules formed on or embedded in the developer layer. Each microcapsule includes a radiation-curable photosensitive resin, a chromogenic material, a photoinitiator for promoting the polymerization of the radiation-curable resin, and if needed a suitable outer coating which covers the internal phase. The radiation-curable resin of the microcapsules in the exposed areas of the medium is polymerized and thus hardened. Since the radiation-curable resin of the microcapsules in the unexposed areas of the medium remain uncured, the microcapsules in the unexposed areas are ruptured upon exposure to a pressure, friction or heat in a subsequent developing process. As a result, the chromogenic material is released from the ruptured microcapsules, and the released chromogenic material reacts with the developer material, thereby forming visible images on the medium, i.e., forming a contrast of the image areas and non-image areas on the medium. This type of photosensitive recording medium is referred to as a "self-activated" type.

The developer material contained in the developer layer may be varous resin acids and acid clays, such as acid earth, inorganic acid or organic acid, as used for pressure-sensitive or carbonless papers.

The microcapsule, which includes the photosensitive resin, photoinitiator and chromogenic material, may further include a suitable sensitizer, and other substances such as a stabilizing agent, a diluent and a dissolution aid, as needed.

The photosensitive resin may be selected from various materials used in the art, for example, selected from the group consisting of: a photo-dimerizable resin which has a photosensitive radical, such as residues of cinnamic acid radical, cinnamylidene radical, $\alpha\beta$-unsaturated ketone radical, coumarin radical, $\alpha$-phenylmaleinimide radical, benzophenone radical, and stilbene radical; a photo-decomposable resin which has a photosensitive radical, such as residues of diazonium radical, quinonediazido radical, azido radical, and benzoin radical; photo-polymerizable resin which has a photosensitive radical, such as residues of acryloyl radical, aryl radical, vinyl radical and epoxy radical; an ethylenically unsaturated organic compound having at least one terminal ethylene group per molecule; an acrylate prepolymer which is derived from the partial reaction of pentaerythritol with acrylic acid or acrylic acid ester; and an isocyanate modified ester.

The photoinitiator and sensitizer may be selected from known substances used in the art. For example, the photoinitiator may be benzoylanthraquinones, benzophenones and acetophenones, while the sensitizer may be anthraquinones, and 5-nitrofluorene.

The chromogenic material may be selected from colorless compounds conventionally used in carbonless paper, which have in their partial skeleton a lactone, a lactam, a sultone, a spiropyran, an ester or an amido structure. More specifically, the colorless compounds may be selected from the group consisting of: triarylmethane compounds; bisphenylmethane compounds; xanthene compounds; thiazine compounds; and spiropyran compounds.

The microcapsules of the plurality of groups which are sensitive to the respective different wavelength bands are evenly distributed over the surface of the photosensitive medium. These microcapsule groups are given different photosensitive properties in terms of the wavelength band within which they are sensitive, by using different photoinitiators. For instance, the microcapsules using 2, 4-dimethyl thioxanthone as the photoinitiator are sensitive to a radiation whose wavelength is 383 nm, while the microcapsules using 4, 4-bis (dimethylamino) benzophenone are sensitive to a radiation whose wavelength is 365 nm. Further, the microcapsules using benzophenone as the photoinitiator are sensitive to a radiation having a wavelength of 250 nm. Thus, the wavelength bands of the microcapsules are determined primarily by the photoinitiator used, and not influenced by the photosensitive resin material.

While the photosensitive resin of the microcapsules normally used is hardened or cured by polymerization upon exposure to a radiation, it is possible to use a photosensitive resin which is depolymerized or becomes brittle upon exposure to the radiation. Examples of radiation-depolymerizable resin materials are 3-oximino-2-butanone methacrylate which undergoes main chain scission upon exposure to ultraviolet radiation, or poly 4'alkyl acylo-phenones. In this case, the images transferred to the photosensitive medium are reversed with respect to the images on the original.

The photosensitive recording medium may consist of a microcapsule sheet having the microcapsules, and a separate developer sheet having the developer material. In this case, the developer sheet is superposed on the image-wise exposed microcapsule sheet, and the superposed sheets are developed, so that the images are formed on the developer sheet. This type of photosensitive medium is referred to as a "transfer type".

The first object of the invention may also be achieved according to another aspect of the invention, which provides a photosensitive recording medium wherein the plurality of microcapsule groups for each color produced by means of the image-forming reaction between the chromogenic material and the developer material have different photosensitive ranges in terms of an amount of exposure to the radiation, i.e., an intensity of the radiation to which the microcapsules are exposed.

In the case where the above photosensitive recording medium is used, the second object of the invention may be achieved also according to the present invention, which provides an image transfer system which includes an image-forming illuminating device adapted to irradiate the original with an image-forming radiation, and selector means operatively associated with the image-forming illuminating device, for changing the intensity of the image-forming radiation in steps to provide a plurality of different intensity levels which are determined by the different photosensitive ranges of the microcapsule groups, so as to change the contrast of the transferred images with respect to the non-image areas of the medium.

According to the above aspect of the present invention, in addition, the image contrast may be stably adjusted, without being influenced by a time-wise or position-wise fluctuation in the intensity of the radiation generated by the image-forming illuminating device. Stated more specifically, the image contrast may be changed in steps corresponding to the intensity levels of the image-forming radiation, which are selected by the selector means. According to the present arrangement, the intensity levels of the image-forming radiation selected by the selector means may be set between the photosensitive ranges of the appropriate two microcapsule groups, or higher than the highest photosensitive range of the least sensitive microcapsule group. In this case, a small deviation of the intensity of the image-forming radiation from the selected nominal level will not change the number of the microcapsule groups whose photosensitive resin is cured, for example, upon exposure to the radiation, since the selected intensity level does not fall within the photosensitive range of any microcapsule groups. Further, the instant medium and system do not require changing the developing condition, such as the nip pressure of developing rollers, and therefore make it possible to use a relatively simple developing device.

The microcapsule groups are given different sensitivities to the radiation intensity (light exposure amount), by changing the materials of the photosensitive resin and photoinitiator, controlling the proportions of these materials, and/or adding a suitable photosensitizer in a suitable amount. The sensitivity differences of the microcapsule groups (from one group to another) are determined based on the operating characteristics of the image-forming illuminating device, namely, a possible fluctuation of the intensity of the image-forming radiation, and other factors.

According to one feature of the image transfer system according to the above aspect of the invention, the photosensitive resin is curable by exposure to the image-forming radiation to inhibit the rupturing of the microcapsules and thereby inhibit the image-forming reaction between the chromogenic material and the developer material. The plurality of intensity levels selected by the selector means are determined so as to inhbit the image-forming reaction of the chromogenic material of at least one of the microcapsule groups, with the developer material. That is, each of the intensity levels, except the highest intensity level, is intermediate between the upper limit of the photosensitive range of one microcapsule group, and the lower limit of the photosensitive range of another microcapsule group whose sensitivity is next higher than the above one group.

According to another feature of the system wherein the intensity level of the image-forming radiation can be changed, the selector means includes a power supply device for supplying electric power to the image-forming illuminating device, and a selector switch connected to the power supply device for changing the amount of electric power supplied to the image-forming illuminating device.

According to a further aspect of the invention, the image transfer system comprises an image-forming illuminating device adapted to generate an image-forming radiation which has a fixed intensity higher than any of the different photosensitive ranges of the microcapsule groups, and an auxiliary illuminating device adapted to generate a contrast-adjusting radiation for irradiating the photosensitive recording medium before or after the image-wise exposure of the medium to the image-forming radiation. The contrast-adjusting radiation may have a fixed radiation lower than the photosensitive range of the least sensitive microcapsule group, or the intensity of the contrast-adjusting radiation may be changed in two or more steps which are determined based on the photosensitive ranges of the microcapsule groups, so as to change the image contrast in the corresponding number of steps. In the former case, the auxiliary illuminating device is either activated or deactivated. In the latter case, the selector means selects one of the intensity levels of the contrast-adjusting radiation.

BRIEF DESCRIPTION OF THE DRAWINGS

The above and other objects, features and advantages of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
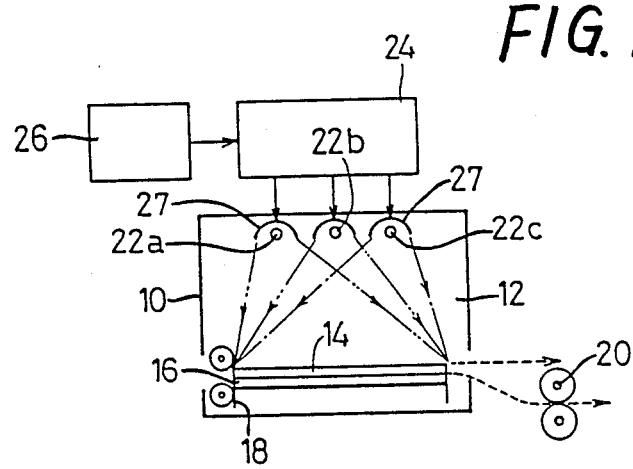
FIG. 1 is a schematic view of one embodiment of an image transfer system of the invention, adapted to be operated with a photosensitive recording medium according to the invention.

Referring first to FIG. 1, there is schematically shown an image transfer system adapted for transferring images from an original 14 to a photosensitive recording medium 16 according to one embodiment of the present invention. The system has a housing 10 in which a darkroom 12 is defined. The original 14 consists of a transparent sheet bearing images on one of its opposite surfaces. The photosensitive recording medium 16, and the original 14 placed on the recording medium 16 are slidably fed on a table fixedly disposed within the darkroom 12, by means of a plurality of pairs of feed rollers (not shown). After the original 14 and the recording medium 16 have passed through the darkroom 12, the original 14 is separated from the recording medium 16 by a suitable separating device, and the recording medium 16 is passed through a pressure nip of a pair of developing rollers 20. As described later in detail, the developing rollers 20 serve as a developing device for developing latent images formed on the recording medium 16, into visible images.

In an upper part of the darkroom 12, there are disposed three light sources in the form of bar-like lamps 22a, 22b, 22c which extend parallel to the surface of the recording medium 16 (original 14), in the direction perpendicular to the direction of feed of the recording medium 16. These three bar-like light source lamps 22a, 22b, 22c cooperate to constitute an illuminating device for irradiating the original 14 and thereby image-wise exposing the recording medium 16 under the original 14. The lamps 2a, 22b, 22c are activated alone or in combination, by means of a power supply device 24, so as to generate ultraviolet radiations which have different wavelengths, for example, 250 nm, 365 nm and 383, respectively. The power supply device 24 is connected to a contrast-adjusting switch 26, and is controlled in response to a signal from the switch 26, so as to selectively activate the lamps 22a, 22b, 22c. Reference numeral 27 designates reflectors 27 for reflecting the radiations emitted by the respective lamps.

The photosensitive recording medium 16 may be a photosensitive paper as disclosed in U.S. Pat. No. 4,399,209. More specifically described referring to FIG. 2, the photosensitive paper 16 consists of a substrate 28 primarily consisting of a paper material, a developer layer 30 formed on the substrate 28 having a developer material, and a microcapsule layer which consists of a multiplicity of microcapsules formed on the developer layer 30. The microcapsule layer consists of three microcapsule groups 32a, 32b, 32c which are evenly distributed over the surface of the developer layer 30. Each of the microcapsules 32a, 32b, 32c includes a normally colorless chromogenic material or color former which reacts with the developer material of the developer layer 30, so as to form a desired colored image spot. The microcapsule further includes a photosensitive or radiation-curable resin which is polymerized and hardened upon exposure to a radiation. The chromogenic material, radiation-curable resin, and other suitable materials constitute an internal phase of the microcapsule, which is covered by a suitable outer coating material, as needed.

The microcapsules of the three microcapsule groups 32a, 32b, 32c further include different photoinitiators so that the radiation-curable resins of the microcapsules 32a, 32b, 32c are polymerized upon exposure to radiations having different wavelength bands. For example, the photoinitiators contained in the microcapsules 32a, 32b, 32c permit the radiation-curable resins to be polymerized by radiations whose wavelengths are in the neighborhood of 250 nm, 365 nm, and 385 nm (wavelengths of the radiations generated by the light source lamps 22a, 22b, 22c), respectively. On the other hand, the microcapsules of the three microcapsule groups 32a, 32b, 32c contain the same chromogenic material which reacts with the developer material to produce the same color, for example, black image spots.

If the contrast-adjusting switch 26 is placed in its maximum contrast position, all of the three light source lamps 22a, 22b and 22c are activated, whereby the original 14 and the photosensitive paper 16 are irradiated with the radiations generated by the three lamps. More particularly, the microcapsules 32a, 32b and 32c in the exposed areas of the paper 16 corresponding to non-image or transparent areas of the original 14 are cured or hardened, while the microcapsules 32a, 32b and 32c in the unexposed areas of the paper 16 corresponding to image areas or opaque areas of the original 14 remain uncured. Thus, latent images corresponding to the images such as characters, symbols and graphic representations on the original 14 are formed on the photosensitive paper 16. The uncured microcapsules 32a, 32b and 32c in the exposed areas of the paper 16 are ruptured when the paper 16 is passed through the pressure nip between the developing rollers 20, whereby the chromogenic materials are released from the ruptured microcapsules. As a result, the released chromogenic materials react with the developer material of the developer layer 30. On the other hand, the cured microcapsules 32a, 32b and 32c in the exposed areas of the paper 16 remain unruptured, and no image-forming reaction takes place in the non-image areas of the paper 16. Thus, the formed images on the paper 16 are given the maximum contrast with respect to the non-image areas.

If the contrast-adjusting switch 26 is placed in its intermediate contrast position, the selected two lamps, e.g., lamps 22a and 22b are activated. In this case, the microcapsules 32a and 32b in the exposed areas of the photosensitive paper 16 are cured, while the microcapsules 32c in the exposed areas remain uncured. These uncured microcapsules 32c are ruptured in the developing process, whereby the non-image areas of the paper 16 are colored due to the reaction between the developer material and the chromogenic material of the ruptured microcapsules 32c. Therefore, the contrast of the formed images with respect to the non-image areas is reduced.

In the case where the contrast-adjusting switch 26 is set in its minimum contrast position, only one of the three light source lamps 22a, 22b, 22c, for example, only the lamp 22a is activated. In this case, only the microcapsules 32a in the exposed areas are cured, while the microcapsules of the other two groups 32b and 32c remain uncured, and are therefore ruptured in the developing process. Consequently, the non-image areas of the paper 16 are colored due to the rupture of the microcapsules 32b and 32c. Accordingly, the image contrast is further reduced.

In the image transfer system which uses the photosensitive recording medium 16 having the three microcapsule groups 32a, 32b and 32c, the three light source lamps 22a, 22b and 22c are selectively activated according to the setting of the contrast-adjusting switch 26, so as to selectively image-wise expose the corresponding three microcapsule groups 32a, 32b, 32c which are sensitive to the respective wavelengths. Namely, the contrast of the image areas with respect to the non-image areas is adjusted in three steps, and is determined depending upon the number of the light source lamps 22a, 22b, 22c which are used to irradiate the photosensitive medium 16, that is, the number of the radiations to which the corresponding microcapsule groups 32a, 32b, 32c are image-wise exposed. According to this arrangement, a time-wise or position-wise fluctuation in the intensity of the radiations generated by the lamps 22a, 22b, 22c will not affect the selected image contrast, since the intensity is determined high enough to assure complete polymerization or curing of the radiation-curable resin of the microcapsules 32a, 32b, 32c. Further, the image contrast is not influenced by a fluctuation in the developing condition. The instant arrangement does not require adjusting the developing condition, i.e., nip pressure of the developing rollers 20, and therefore eliminate a mechanism for changing the nip pressure. Accordingly, the developing device as a whole can be made simple in construction, and is economical to manufacture.

Figure 2:
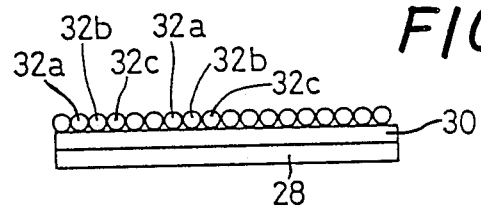
FIG. 2 is an illustration of the photosensitive recording medium used in the system of FIG. 1.
Figure 3:
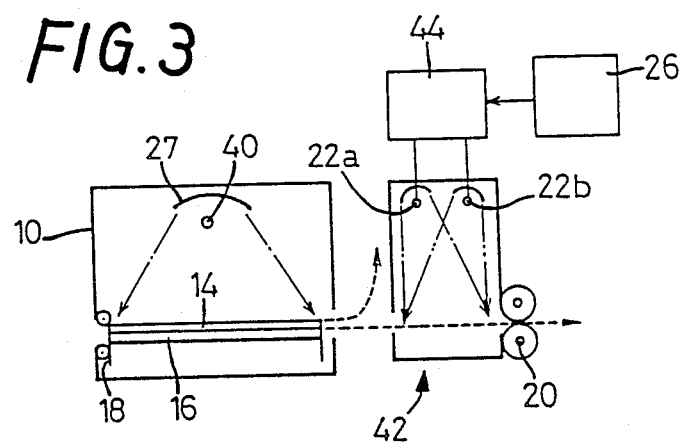
FIG. 3 is a schematic view of another embodiment of the image transfer system of the invention.

Referring next to FIG. 3, another embodiment of the image transfer system of the invention will be described. In the interest of brevity and simplification, the same reference numerals as used in FIGS. 1 and 2 will be used to identify corresponding elements.

This modified embodiment uses an image-forming illuminating device 40 disposed within the housing 10, and an auxiliary illuminating device 42 disposed between the housing 10 and the developing rollers 20. The image-forming illuminating device 40 is adapted to generate an image-forming radiation whose wavelength band covers the different wavelength bands to which the three microcapsule groups 32a, 32b and 32c are sensitive, respectively. The photosensitive paper 16 is image-wise exposed to the radiation from the image-forming illuminating device 40, such that the microcapsules 32a, 32b, 32c in the exposed areas are all cured or hardened, while the microcapsules 32a, 32b, 32c in the unexposed areas all remain uncured. Thus, latent images are formed on the photosensitive paper 16. The auxiliary illuminating device 42 has the light source lamps 22a and 22b identical with those used in the preceding embodiment. These lamps 22a, 22b are driven by a power supply device 44 which is controlled in response to a signal from the contrast-adjusting switch 26. If the switch 26 is placed in its maximum contrast position, none of the two lamps 22a, 22b is activated. With the switch 26 set in its intermediate contrast position, only one of the two lamps 22a, 22b, e.g., lamp 22a, is activated. With the switch 26 set in its minimum contrast position, the two lamps 22a and 22b are activated.

In the image transfer system according to the present embodiment, when only the lamp 22a is activated, microcapsules 32a which remain uncured after the exposure to the image-forming radiation are cured due to exposure to the radiation generated by the lamp 22a, and are therefore inhibited from undergoing the image-forming reaction of the chromogenic material with the developer layer 30. Accordingly, the density of the formed images is reduced. In the case where the lamps 22a and 22b are both activated, the microcapsules 32a and 32b are both cured and inhibited from undergoing the image-forming reaction. In this case, the image density is further reduced, and the image contrast with respect to the non-image areas is made lowest. Thus, the image contrast is adjusted in three steps, as in the preceding embodiment. While the preceding embodiment is adapted to change the density of the non-image areas, the present embodiment is adapted to change the density of the image areas, i.e., the density of the positive images.

Although the photosensitive recording medium 16 used in the illustrated image transfer systems has the three microcapsule groups 32a, 32b and 32c, it is possible that the microcapsules on the medium 16 consist of two, or four or more different microcapsule groups having different sensitivities in terms of the wavelength of a radiation to which the microcapsules are sensitive.

Further, the proportions in number of the microcapsules 32a, 32b and 32c may be determined so as to provide desired values of the image contrast.

In the illustrated embodiments, the three image-forming light source lamps 22a, 22b and 22c, or the two auxiliary light source lamps 22a and 22b are selectively activated to generate the corresponding radiations having different wavelengths. It is possible to use a single light source which generates light rays having a wide wavelength band, and a plurality of optical filters which permit passage of the light rays whose wavelengths fall within the wavelength bands of the microcapsules 32a, 32b, 32c, respectively. In this case, the optical filters, which constitute part of the illuminating device, are selectively placed in position, according to a signal from a suitable selector device connected to the contrast-adjusting switch 26.

While the original 14 is placed on the photosensitive recording medium 16 so that the medium 16 is irradiated through the original 14, the medium 16 may be irradiated with light rays reflected by the original 14 which is disposed above the medium 16. In this case, a suitable optical focusing device is disposed between the original 14 and the medium 16.

While the auxiliary illuminating device 42 in the second embodiment of FIG. 3 is disposed downstream of the housing 10, namely, between the image-forming illuminating device 40 and the developing device 20, the auxiliary illuminating device 42 may be positioned upstream of the image-forming illuminating device 40.

Although the microcapsules 32a, 32b and 32c of the illustrated photosensitive medium 16 are adapted to effect imaging in a single color, the principle of the invention may be applied to a color printing by using the three complementary colors (cyan, magenta and yellow) of the three primary colors of light (red, green and blue). In this instance, the microcapsules for each color consist of a plurality of microcapsule groups which are sensitive to different wavelength bands of radiation.

Figure 4:
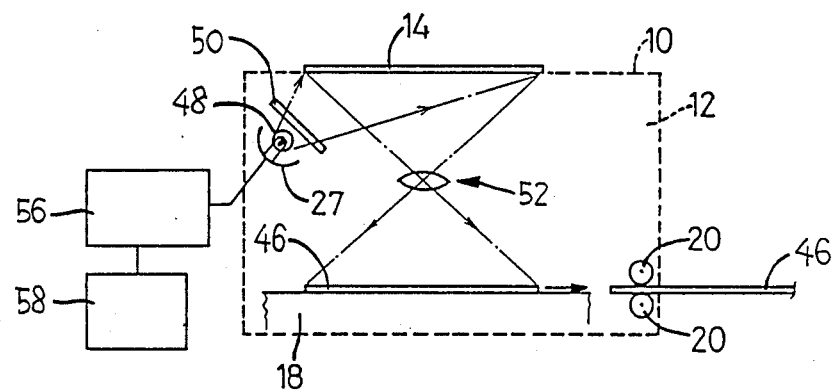
FIG. 4 is a view showing an image transfer system operable with another form of the photosensitive recording medium according to the invention.
Figure 5:
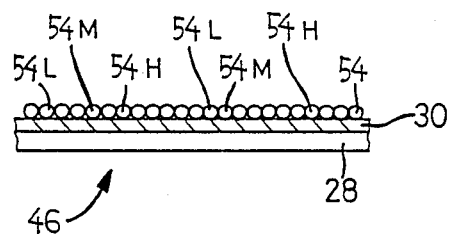
FIG. 5 is an illustration of the photosensitive recording medium of FIG. 4.

Referring further to FIG. 4, there is illustrated a further embodiment of the image transfer system of the present invention, which is adapted to be operated with a modified form of a photosensitive recording medium 46 which is fabricated also according to the invention. In the instant image transfer system, the original 14 is supported on a transparent support such as a glass plate (not shown) fixed in the housing 10, such that the original 14 is located in parallel, spaced-apart relation with the medium 46. In the darkroom 12 defined by the housing 10, there is also disposed an image-forming illuminating device in the form of a bar-like lamp 48 which extends parallel to the original 14, in the direction perpendicular to the feeding direction of the recording medium 16. The lamp 48 is provided with the reflector 27, and is adapted to generate a radiation for irradiating the lower surface of the original 14, through an ordinary filter 50 which may be eliminated. The radiation generated by the lamp 48 is reflected by the original 14, and the reflected radiation is incident upon the medium 46, through an optical focusing device 52 which has a convex lens for focusing the reflected light on the surface of the medium 46.

The lamp 48 is activated by a power supply device 56 which is controlled in response to a signal from a contrast-adjusting swtich 38. More specifically, the amount of electric power that is supplied from the power supply device 56 to the lamp 48 is changed in three steps, according to the setting of the contrast-adjusting switch 58. Thus, the power supply device 56 and the switch 58 serve as a selector for changing the intensity of the radiation generated by the illuminating device 48.

Figure 6:
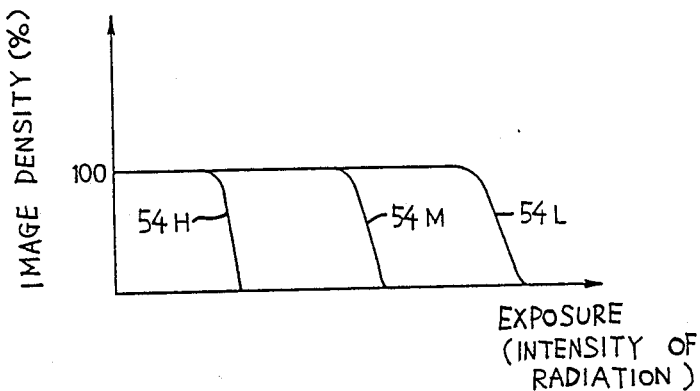
FIG. 6 is a graphical representation showing sensitivity characteristics of three different groups of microcapsules of the recording medium of FIG. 5.

The photosensitive recording medium 46 is structurally similar to the recording medium 16 shown in FIG. 2. However, the medium 46 uses microcapsules which are different from the microcapsules 32a, 32b and 32c. Namely, the microcapsules of the microcapsule layer 54 of the medium 46 consist of three microcapsule groups 54L, 54M and 54H which have different photosensitive ranges in terms of an amount of exposure to the incident radiation. Since all microcapsules on the medium 46 are exposed to the radiation for the same length of time, the amount of light exposure of the microcapsules is proportional to the intensity of the incident radiation. In other words, the microcapsules of the three groups 54L, 54M and 54H have different photosensitive ranges in terms of the radiation intensity. As shown in FIG. 6, the microcapsules 54L which have a low sensitivity, are sensitive to a radiation whose intensity is relatively high. In other words, the polymerization or curing of the radiation-curable resin of the microcapsules 54L requires a relatively large amount of exposure to the radiation. The microcapsules 54H having a high sensitivity, are sensitive to a radiation whose intensity is relatively low, and the microcapsules 54M having an intermediate sensitivity are sensitive to a radiation whose intensity is intermediate between the high and low intensity levels of the radiations to which the microcapsules 54L and 54H are sensitive. As previously indicated, the image density is maximm when the radiation-curable resin of the microcapsules remains completely uncured, and the density is minimum when the resin is completely cured or polymerized. As illustrated in FIG. 6, the image density obtained by the microcapsules 54H is varied in a relatively low range of the radiation intensity, while the density obtained by the microcapsules 54L is varied in a relatively high range of the radiation intensity. The density obtained by the microcapsules 54M is varied in an intermediate range of the radiation intensity.

The sensitivity of the microcapsule groups 54H, 54M and 54L is determined by the radiation-curable resin material, photoinitiator and photosensitizer, that are encapsulated wihhin the microcapsules, and by the proportions of these materials.

Figure 7:
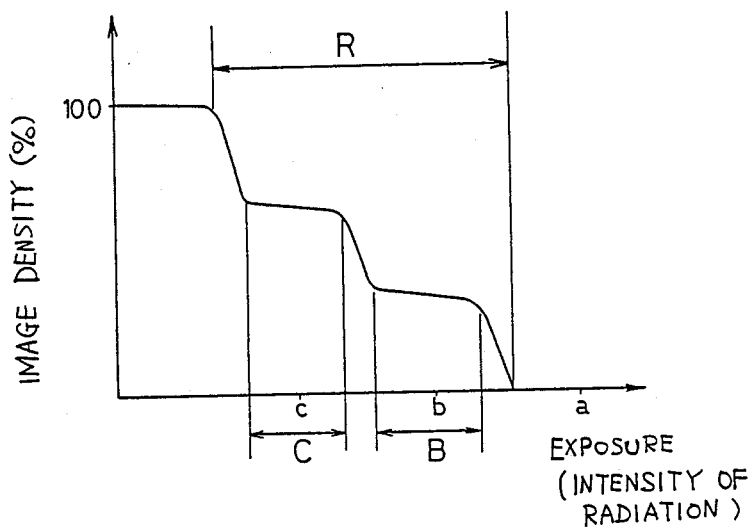
FIG. 7 is a graph illustrating three different intensity levels of an image-forming radiation, in relation to the sensitivity curve of the recording medium of FIG. 5.

With the photosensitive recording medium 16 having the three microcapsule groups 54H, 54M and 54L with different sensitivities, the image density (degree of polymerization of the resin) obtained is not substantially varied when the intensity level of the incident radiation falls within one of two intermediate ranges B and C, as indicated in FIG. 7. The intermediate range B is defined by the upper limit of the photosensitive range of the microcapsules 54M, and the lower limit of the photosensitive range of the microcapsules 54L. The other intermediate range C is defined by the upper limit of the photosensitive range of the microcapsules 54H, and the lower limit of the photosensitive range of the microcapsules 54M. However, when viewed as a whole, the image intensity obtained by the present recording medium 46 is varied over a photosensitive range R which includes the intermediate ranges B and C.

If the contrast-adjusting switch 58 is placed in its maximum contrast position, the radiation generated by the lamp 48 is given a relatively high intensity indicated at "a" in FIG. 7, which is sufficient to completely polymerize or cure the radiation-curable resin materials of all groups of microcapsules 54L, 54M and 54H in the exposed areas of the medium 48 which correspond to the non-image areas of the original 14. In this case, therefore, none of the microcapsules 54L, 54M and 54H in the exposed areas is ruptured. In other words, all microcapsules in the exposed areas are inhibited from undergoing an image-forming reaction between the chromogenic material and the developer material. This, the images formed by the microcapsules in the unexposed areas of the medium 46 corresponding to the image areas of the original 14 are given the maximum contrast with respect to the non-image areas.

If the contrast-adjusting switch 58 is placed in its intermediate contrast position, the radiation generated by the lamp 48 is given an intermediate intensity level indicated at "b" in FIG. 7, which falls within the intermediate range B in which the image density (degree of polymerization) is substantially constant. In this case, the radiation intensity is insufficient to polymerize or cure the radiation-curable resin of the least sensitive microcapsules 54L, whereby the microcapsules 54L in the exposed areas are ruptured in the developing process. Consequently, the image-forming reaction of the microcapsules 54L occurs even in the non-image areas of the medium 46. Accordingly, the image contrast is reduced.

In the case where the switch 58 is set in the minimum contrast position, the intensity of the radiation generated by the lamp 48 is set at a comparatively low level indicated at "c" in FIG. 7, which falls within the intermediate range C. In this case, the microcapsules 54L and 54M in the exposed areas of the medium 46 remain uncured and are ruptured in the developing process. Therefore, the image-forming reaction of the microcapsules 54L and 54M occurs even in the non-image areas of the medium 46. Accordingly, the image contrast is further reduced.

In the present image transfer system using the photosensitive recording medium 46, the image contrast is adjusted in three steps, by changing the intensity of the radiation generated by the image-illuminating device 48, in corresponding three steps, namely, by selecting one of the three intensity levels "a", "b" and "c" which are determined based on the photosensitive ranges of the three microcapsule groups 54L, 54M and 54H, so as to inhibit the polymerization or curing of the radiation-curable resin of at least one of the three microcapsule groups 54L, 54M and 54H. Preferably, the high intensity level "a" is set to be sufficiently higher than the upper limit of the photosensitive range of the least sensitive microcapsule group 54L, and the intermediate and low intensity levels "b" and "c" are set in the middle of the respective intermediate ranges B and C.

According to the contrast adjusting arrangement, the image contrast (density of the non-image areas) obtained on the medium 46 will not be influenced by a fluctuation in the selected intensity of the radiation due to a change in the temperature of the lamp 48, for example. Further, the adjustment of the image contrast does not require an adjustment in the nip pressure of the developing rollers 20. Thus, the instant arrangement provides the same advantages as offered by the preceding embodiments.

In the present embodiment, too, the medium 46 may be modified to effect a color printing. In this case, the microcapsules for each of the three complementary colors, cyan, magenta and yellow, consist of a plurality of microcapsule groups having different photosensitive ranges in terms of the intensity level of the radiation generated by the image-illuminating device 48.

While the intensity level of the radiation generated by the lamp 48 is changed by the controlled amount of power supply from the power supply device 56, it is possible modify the lamp 48 so as to generate a light beam having a fixed intensity, and modify the optical filter 50 so that the filter 50 has three operating positions to change the intensity of the light beam that has passed through the filter 50. In this case, the optical filter 50.

Further, the illustrated arrangement 48, 56, 58 may be replaced by an arrangement which includes an image-forming illuminating device and an auxiliary illuminating device. The image-forming device is adapted to generate an image-forming radiation which has a fixed intensity higher than the photosensitive range of the least sensitive microcapsule group 54L. The auxiliary illuminating device is adapted to generate a contrast-adjusting radiation for irradiatiang the medium 46 before or after the medium 46 is image-wise exposed to the image-forming radiation. The intensity of the contrast-adjusting radiation may be either fixed, or may be changed in steps. In either case, the intensity of the contrast-adjusting radiation is lower than the photosensitive range of the least sensitive microcapsule group 54L, for example, set at the level indicated at "b" or "c" in FIG. 7. If the auxiliary illuminating device is activated generating the radiation having the fixed intensity "c" for example, the microcapsules 54H throughout the medium 46 are cured and remain unruptured, whereby the density of the image areas is reduced, while the density of the non-image areas is held at a substantially zero level.

It will be understood that the present invention is not limited to the details of the illustrated embodiments and the described modifications, but may be embodied with various other changes, modifications and improvements which may occur to those skilled in the art, without departing from the spirit and scope of the invention defined in the following claims.

What is claimed is:

1. A photosenitive recording medium comprising a substrate, a multiplicity of microcapsules on one surface of said substrate, and a developer material, each of the microcapsules including a photosenitive resin and a normally colorless chromogenic material corresponding to one color, wherein images are formed by image-wise selectively exposing said multiplicity of microcapsules to a radiation, rupturing microcapsules in image areas and releasing chromogenic matierial from the ruptured microcapsules, so that an image-forming reaction between the released chromogenic material and the developer material occurs to produce said color, said multiplicity of microcapsules comprising a plurality of microcapsule groups for said color, said multiplicity of microcapsules of said plurality of microcapsule groups being substantially evenly distributed over said one surface of said substrate, said plurality of microcapsule groups being sensitive to a respective plurality of radiations having respective different wavelength bands, such that when said plurality of microcapsule groups is image-wise exposed to a number of said plurality of radiations, said number being between one of and all of said plurality of radiations, a contrast between formed images on the medium and non-imaged areas on the medium can be adjusted by varying said number.

2. A photosensitive recording medium comprising a substrate, a multiplicity of microcapsules on one surface of said substrate, and a developer material, each of the microcapsules including a photosensitive resin and a normally colorless chromogenic material corresponding to one color, wherein images are formed by image-wise selectively exposing said multiplicity of microcapsules to a radiation, rupturing microcapsules in image areas and releasing chromogenic material from the ruptured microcapsules, so that an image-forming reaction between the released chromogenic material and the developer material occurs to produce said color, said multiplicity of microcapsules comprising a plurality of microcapsule groups for said color said multiplicity of microcapsules of said plurality of microcapsule groups being substantially evenly distributed over said one surface of said substrate, said plurality of microcapsule groups being sensitive to respective different amounts of exposure to the radiation, an amount of exposure being equal to the product of the intensity of radiation times the length of time exposure, so that a contrast between imaged and non-imaged areas on said medium is variable depending upon an amount of the radiation to which said plurality of microcapsule groups is image-wise exposed.

* * * * *